Feb. 12, 1963 J. M. BROWNLOW 3,077,021

METHOD OF FORMING MEMORY ARRAYS

Filed May 27, 1960

INVENTOR
JAMES M. BROWNLOW

BY William V. Schelberg
AGENT

United States Patent Office 3,077,021
Patented Feb. 12, 1963

3,077,021

METHOD OF FORMING MEMORY ARRAYS

James M. Brownlow, Fishkill, N.Y., assignor to International Business Machines Corporation, New York, N.Y., a corporation of New York Filed May 27, 1960, Ser. No. 32,360
8 Claims. (Cl. 25—156)

This invention relates to a method of making memory arrays composed of a plurality of high-speed, bistable, open flux path magnetic elements secured on a substrate member.

High speed, open flux path memory elements consist of ferrite or other material in the shape of small rods, bars, fibers, or tubes which have remanence in the plane of the element. Within certain dimensions, in particular, a thickness of less than 25 microns, these open flux path elements exhibit high switching speeds not obtainable previously with conventional thick toroidally shaped ferrite memory elements. Due to their small size these elements are not easily fabricated into large scale memory arrays. Direct attachment to a substrate member has been found to result in contamination of the memory ferrite bits. Individual handling of these bits also presents considerable difficulty.

Accordingly, an object of the present invention is to provide a method of fabricating large scale memory arrays consisting of high-speed open flux path memory elements.

The foregoing and other objects, features and advantages of the invention will be apparent from the following more particular description of preferred embodiments of the invention, as illustrated in the accompanying drawings.

In the drawings:

FIGURE 1 is a schematic representation of the first step in the process; namely, the step in which a substrate is provided with a layer of the initial bonding mixture.

Figure 1:
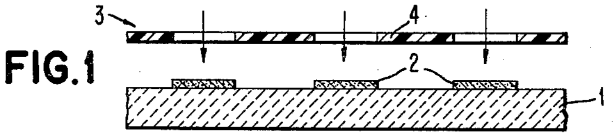
FIGURES 1–3 illustrate the several steps in the method of the present invention.
Figure 1A:
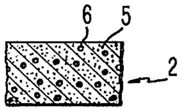

FIGURE 1*a* is a sectional view of the initial bonding mixture.

Figure 2:
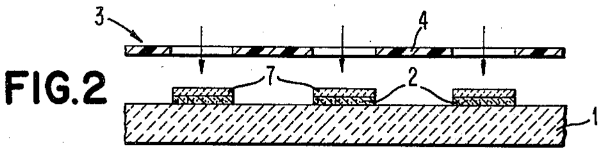

FIGURE 2 shows the positioning of the ferrite layer atop the initial bonding mixture layer.

Figure 3:
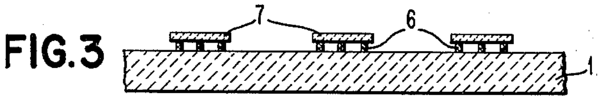

FIGURE 3 depicts the resultant memory array after firing.

FIGURES 4–7 illustrate the steps in forming a tubular bit memory array.

Figure 4:
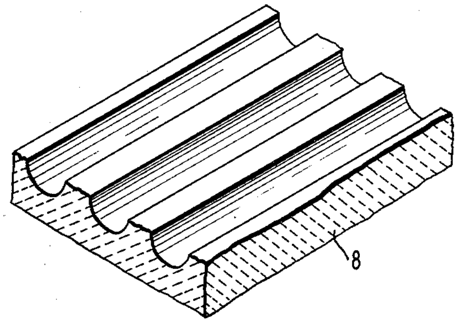

FIGURE 4 shows the substrate structure.

Figure 5:
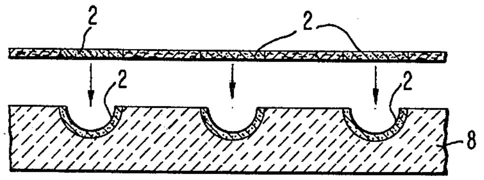

FIGURE 5 shows the initial bonding mixture in place on the substrate.

Figure 6:
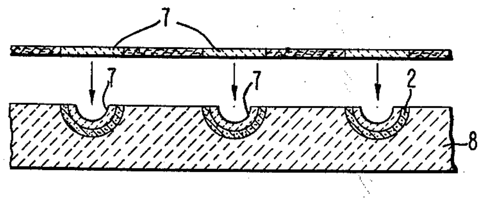

FIGURE 6 shows the ferrite and initial bonding mixture positioned on the substrate.

Figure 7:
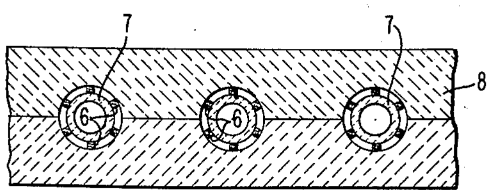

FIGURE 7 shows the fired memory array.

According to the present invention there is provided a method for producing large arrays of high speed, open flux path memory elements wherein the individual memory bits are formed on a non-contaminating substrate. Specifically, the method comprises first providing a substrate member with the initial bonding mixture comprising a mixture of a combustible organic constituent and a non-volatile inorganic powder, the initial bonding mixture being placed only in the areas where the bits are to be attached. Thereafter the high speed open flux path ceramic ferrite bits, in the form of, for example, thin rectangular slabs, are placed on the initial bonding mixture. Finally the resultant laminated structure is fired at elevated tempeartures to form, thereby, a memory array of the ceramic bits firmly tacked or bonded to the substrate by fine particles of the inorganic constituent which were present in the initial bonding mixture.

The memory bits in the array thus produced is shown to exhibit the same properties as when tested individually, which indicates that the bits are not contaminated during formation and attachment on the substrate. The process of the present invention is amenable to the preparation of arrays of ceramic material of any suitable composition; those which are disclosed herein are presented merely by way of illustrating the wide utility of the invention.

The support or substrate must be capable of withstanding elevated firing temperatures. Any ceramic plate which is non-reactive with the ferrite itself may be used. The ceramics $Mn_{2.8}Ti_{0.1}Fe_{0.1}O_4$ and $Mn_{2.0}Ti_{0.1}Al_{0.9}O_4$ are quite suitable.

Inert substrates such as platinum or palladium may be used as well.

As illustrated particularly in FIGURE 1, the process steps of the present invention include providing a substrate 1 with layers of the initial bonding mixture 2 in the desired configuration of the memory bit in the array. The initial bonding mixture may be applied through a fine silk screen 3 which is appropriately masked with a sheet of plastic 4. The initial bonding mixture, as shown in FIGURE 1*a*, has predominantly volatile organic constituents 5 and a small percentage of a non-volatile inorganic material 6, such as a ferrite of the same composition as the memory bits themselves. A suitable initial bonding mixture is the following:

2.5 g. Carbon Black (Fisher G)—(carbon)
1.25 g. Ethocel (Dow 50 c.p.s.)—(Ethyl Cellulose)
23.75 g. Pine Oil (Fisher)—(Liquid Resins)
2.0 g. Varish (G.E. 1201)—(Binder)
0.1 g. Ferrite ($Fe_{1.63}Mn_{1.25}Cr_{0.06}Ni_{0.03}O_4$) (Calcined and milled at 850°) (inorganic)

Preferably the inorganic constituent should constitute about 1% or less by weight of the total initial bonding mixture.

As shown in FIGURE 2, the ferrite bits 7 are then applied atop the initial bonding mixture. Several methods have been used for applying the ferrite, including spraying, ruling and dipping. A particularly advantageous method involves the formation of a decalcomania of the ferrite. Accordingly a glass slide is coated with a 2 percent gelatin-water solution and dried. The thus treated glass slide then is dipped into a solution of 3 grams of ethyl cellulose, such as that product sold by the Dow Chemical Company under the tradename of "Ethocel" (c.p.s. 50 viscosity), and 40 grams of pine oil and dried. A ferrite ink containing the memory ferrite material in a suitable binder is then silk screened onto the glass slide in the form of the bits of the resultant memory array. The slide is dried again and dipped in water whereupon the gelatin dissolves and the ferrite bits float off in the form of the decal. A typical ferrite ink formulation consists of 43 grams of the ferrite, 40 grams of pine oil and 3 grams of ethyl cellulose. This formula may be used effectively with a 160 mesh screen to provide a bit area of 0.2 inch by 0.02 inch and a thickness of about 0.5 mils.

The decal thus produced is placed over the initial bonding mixture and held in place with water or an adhesive. The structure is then ready for firing. Initially it is heated slowly to 500° C. in air to drive off the binder constituents. Then the temperature is raised to 900° whereupon the carbon constituent of the initial bonding mixture burns off leaving only widely separated sintered particles of inorganic material to tack or bond the ferrite bits in place on the substrate. These particles effectively bond the ferrite to the substrate but in the process do not contaminate the ferrites. (See FIGURE 3.) The final firing takes place at about 1400° C. in air for 15 minutes to several hours, suitably for about an hour. Thus at no time during the firing are the ferrite bits themselves permitted to touch the substrate.

A modification of the method of the present invention is illustrated in FIGURES 4–7. In particular there is shown a method of producing ceramic arrays composed of tubular elements. The method is similar to that described above. The differences lie in the use of two similar hemispherical grooved substrates 8 (see FIGURE 4) which are placed above each other to form a circular substrate. The initial bonding mixture 2 and the decal containing the ferrite is positioned therebetween (see FIGURE 7). During the final sintering the decal halves cement together to produce a tubular element which is held in place on the circular substrate by the fine particles of the sintered inorganic material originally present in the initial bonding mixture layer.

Some of the compounds which have been used in the method of the present invention include chromium-manganese ferrites, magnesium-manganese ferrites, and yttrium-iron garnets.

A particularly advantageous feature of the method of the present invention is that it produces arrays composed of uncontaminated high speed, open flux path memory bits. For example, such properties of the ferrite element as squareness of the hysteresis loop, coercive force and switching constants are quite identical when it is present as a member of the array. This behavior results from the fact that only a small quantity of inorganic constituent of the initial bonding mixture is used to bond the magnetic material to the substrate.

The memory arrays shown herein may be provided with various write, read and sense windings, as are required in one of the several memory selection schemes known in the art. The windings may be applied by printed circuit techniques or otherwise as desired.

What has been described herein is a method for producing memory arrays composed of bistable high speed, open flux path magnetic elements. The method is also capable, in general, of producing an array of individual elements of any ceramic material firmly tacked or bonded to a substrate member.

While the invention has been particularly shown and described with reference to preferred embodiments thereof, it will be understood by those skilled in the art that various changes in form and details may be made therein without departing from the spirit and scope of the invention.

What is claimed is:

1. A method of making an array of ceramic elements bonded to an inert substrate which comprises placing on said substrate in the shape of said elements a layer of an initial bonding mixture consisting essentially of an intimate mixture of mainly low temperature combustible organic constituents and about 1% of an unfired inorganic material, applying a thin layer of the pre-sintered constituents of said ceramic element on top of said bonding mixture, and firing the structure as formed to elevated temperatures to form thereby an array of ceramic elements discretely spaced from and bonded to an inert substrate by widely separated sintered particles of said inorganic material.

2. The method according to claim 1 wherein said ceramic element is composed of a magnetic material.

3. The method according to claim 1 wherein said inorganic material is of the same composition as said ceramic element.

4. The method according to claim 1 wherein the initial bonding mixture consists essentially of carbon, combustible organic binders and about 1% of an inorganic constituent.

5. A method of making a high speed open flux path magnetic memory array comprising a plurality of magnetic ceramic elements discretely spaced from and bonded to an inert substrate by widely separated sintered particles of an inorganic material, which comprises placing on said substrate in the shape of said elements a layer of an initial bonding mixture consisting essentially of an intimate mixture of mainly low temperature combustible organic constituents and about 1% of an unfired inorganic material, applying a thin layer of the constituents of said magnetic element on top of said bonding mixture, and firing the structure as formed to elevated temperatures to decompose said organic constituents and to secure said elements to said substrate by said inorganic material to form thereby an array of ceramic elements discretely spaced from and bonded to an inert substrate by widely separated sintered particles of said inorganic material.

6. A method of making a high speed open flux path memory array comprising a plurality of magnetic ceramic memory elements discretely spaced from and bonded to an inert substrate by widely separated sintered particles of an inorganic material, said sintered particles occuping only a small fraction of the total area of said element which comprises silk screening on said substrate in the shape of said elements a thin layer of an initial bonding mixture consisting essentially of an intimate mixture carbon, low-temperature combustible organic binders and about 1% of the unfired powders of the same composition as said magnetic element, forming a decal of said magnetic element in the form of said memory element, placing the decal on the initial bonding mixture so that the magnetic element is in contact with said initial bonding mixture and firing the structure as formed slowly to 500° in air, then raising the temperature slowly to 900° and finally firing at 1400° in air for an hour to decompose said organic constituents and to discretely space from and bond said elements to said substrate by widely separated sintered particles of said inorganic material.

7. The method according to claim 6 wherein the magnetic material is composed of a ferrite having the dimensions 0.2 inch by 0.02 inch by 0.5 mil.

8. A method of making a memory array composed of tubular ceramic memory elements discretely spaced from and bonded to a substrate which comprises the steps of providing a ceramic substrate having a plurality of longitudinally extending hemispherical grooves, placing in said grooves a decal of an initial bonding mixture consisting essentially of an intimate mixture of mainly low temperature combustible organic constituents and about 1% of an unfired high temperature inorganic material, applying a decal of said ceramic element on top of said initial bonding mixture, placing a second similarly prepared substrate atop said first substrate, and firing said structure as formed slowing to 500° in air to drive off said binder constituents, raising the temperature slowly to 900° and finally firing at 1400° in air for an hour to form thereby a tubular ceramic element discretely spaced from and bonded in the substrate by widely spaced sintered particles of said inorganic material.

References Cited in the file of this patent

UNITED STATES PATENTS

| | | |
|---|---|---|
| 2,131,887 | Friederich et al. | Oct. 4, 1938 |
| 2,134,752 | Ehlers | Nov. 1, 1938 |
| 2,618,579 | Brajer | Nov. 18, 1952 |
| 2,666,008 | Enslein et al. | Jan. 12, 1954 |
| 2,692,190 | Pritikin | Oct. 19, 1954 |
| 2,743,506 | Solow | May 1, 1956 |
| 2,771,969 | Brownlon | Nov. 27, 1956 |
| 2,919,432 | Broadbent | Dec. 29, 1959 |
| 2,945,217 | Fisher et al. | July 12, 1960 |